United States Patent
Hirade

[11] Patent Number: 5,858,868
[45] Date of Patent: Jan. 12, 1999

[54] METHOD OF MANUFACTURING A LAMINATED WIRING STRUCTURE PREVENTING IMPURITY DIFFUSION THEREIN FROM N+ AND P+ REGIONS IN CMOS DEVICE WITH OHMIC CONTACT

[75] Inventor: Seiji Hirade, Hamamatsu, Japan

[73] Assignee: Yamaha Corporation, Hamamatsu, Japan

[21] Appl. No.: 631,036

[22] Filed: Apr. 15, 1997

Related U.S. Application Data

[63] Continuation of Ser. No. 252,088, Jun. 1, 1994, abandoned, which is a continuation-in-part of Ser. No. 58,868, May 6, 1993, abandoned.

[30] Foreign Application Priority Data

May 8, 1992 [JP] Japan .................................. 4-143305
Jun. 4, 1993 [JP] Japan .................................. 5-160082

[51] Int. Cl.⁶ .................................................. H01L 21/44
[52] U.S. Cl. ...................... 438/597; 438/643; 438/648; 438/653; 438/656; 438/663; 438/655
[58] Field of Search .................................. 438/597, 618, 438/621, 642, 643, 648, 649, 663, 652, 653, 656, 655

[56] References Cited

U.S. PATENT DOCUMENTS

| | | | |
|---|---|---|---|
| 4,640,004 | 2/1987 | Thomas et al. ........................ | 437/190 |
| 4,784,973 | 11/1988 | Stevens et al. ....................... | 437/200 |
| 4,821,085 | 4/1989 | Haken et al. . | |
| 4,829,363 | 5/1989 | Thomas et al. . | |
| 4,845,055 | 7/1989 | Ogata .................................. | 437/247 |
| 4,884,123 | 11/1989 | Dixit et al. ........................... | 437/190 |
| 4,887,146 | 12/1989 | Hinode . | |
| 4,890,141 | 12/1989 | Tang et al. . | |
| 4,920,071 | 4/1990 | Thomas ................................ | 437/195 |
| 4,920,073 | 4/1990 | Wei et al. . | |
| 4,994,410 | 2/1991 | Sun et al. ............................. | 437/200 |
| 5,094,981 | 3/1992 | Chung et al. ......................... | 437/190 |
| 5,155,063 | 10/1992 | Ito ....................................... | 437/192 |
| 5,162,262 | 11/1992 | Ajika et al. ........................... | 437/190 |
| 5,202,287 | 4/1993 | Joshi et al. ........................... | 437/190 |
| 5,240,880 | 8/1993 | Hindman et al. ..................... | 437/192 |
| 5,242,860 | 9/1993 | Nulman et al. ....................... | 437/200 |
| 5,278,099 | 1/1994 | Maeda .................................. | 437/190 |
| 5,326,724 | 7/1994 | Wei ...................................... | 437/190 |
| 5,371,041 | 12/1994 | Liou et al. ............................ | 437/190 |
| 5,395,795 | 3/1995 | Hong et al. ........................... | 437/190 |
| 5,444,018 | 8/1995 | Yost et al. ............................ | 437/192 |

FOREIGN PATENT DOCUMENTS

| | | |
|---|---|---|
| 62-43174 | 2/1987 | Japan . |
| 1291450 | 11/1989 | Japan . |
| 3101253 | 4/1991 | Japan . |
| 3230573 | 10/1991 | Japan . |

OTHER PUBLICATIONS

Fair, Richard B., "Rapid Thermal Processing" Science and Technology, Academic Press, Inc. Harcourt Brace Javanovich, Publishers, pp. 264–292.

Chen et al. A New Device Interconnect Scheme For Sub–Micron VLSI, IEDM 84, 1984, pp. 118–121.

Contact Resistance Improvement For Tungsten Metallurey, IBM TDB, vol. 32, No. 8B, Jan. 1990, p. 50.

*Primary Examiner*—Tuan H. Nguyen
*Attorney, Agent, or Firm*—Pillsbury Madison & Sutro LLP

[57] ABSTRACT

Regions of $n^+$- and $p^+$-types of a semiconductor device are interconnected with a laminated wiring having a low wiring resistance. On the surface of a semiconductor substrate (10), an insulating film (20) is formed covering a field insulating film (12). Contact holes for the $n^+$- and $p^+$-type regions are formed in the insulating film (20) at areas corresponding to the $n^+$- and $p^+$-type regions. Thereafter, a refractory metal layer (30A) such as Ti for forming an ohmic contact having a thickness of 100 angstroms or less, an impurity diffusion preventing conductive layer (32A) such as TiN layer, and a refractory metal layer or refractory metal silicide layer (34A) such as W or WSi layer, are formed sequentially in this order from the bottom. A laminated structure of these layers (30A, 32A, 34A) is patterned to form a wiring layer (36). The laminate is subjected to rapid thermal annealing for ohmically contacting the laminate to the $n^+$ and $p^+$-type regions.

28 Claims, 5 Drawing Sheets

METHOD OF MANUFACTURING A LAMINATED WIRING STRUCTURE PREVENTING IMPURITY DIFFUSION THEREIN FROM N+ AND P+ REGIONS IN CMOS DEVICE WITH OHMIC CONTACT

This application is a continuation of application Ser. No. 08/252,088, filed Jun. 1, 1994, now abandoned, which is a continuation-in-part of application Ser. No. 08/058,868, filed May 6, 1993, now abandoned.

BACKGROUND OF THE INVENTION a) Field of the Invention

The present invention relates to a laminated semiconductor interconnection wiring structure of a semiconductor device such as a complementary MOS type LSI having regions of opposite conductivity types ($n^+$ and $p^+$ regions) to be connected to an electrode.

b) Description of the Related Art

A known conventional complementary MOS type LSI using refractory metal wiring has such a wiring structure as shown in FIG. 5 (for example, refer to JP-A 3-101253).

On the surface of a silicon substrate 10, there are formed a field insulating film 12, a thin insulating film 14, an $n^+$-type region 16, a $p^+$-type region 18, and other regions (not shown). After forming an insulating film 20 above the substrate, a contact hole is formed in the insulating films 20 and 14 at the area corresponding to the $p^+$-type region 18. A polycrystalline silicon layer 22 is then deposited covering the contact hole.

Next, a contact hole is formed through the polycrystalline layer 22 and the insulating films 20 and 14 down to the $n^+$-type region 16. A TiN (titanium nitride) layer 24 and a WSi (tungsten silicide) layer 26 are deposited in this order. A resist mask is formed on the WSi layer 26. By using this resist mask, $p^+$-type impurity ions are heavily doped selectively into a partial region of the polycrystalline layer 22 via which electrical connection to the $p^+$-type region 18 is provided. The partial region of the polycrystalline layer 22 therefore becomes $p^+$-type of low resistance. Thereafter, the laminated structure of the polycrystalline layer 22, TiN layer 24, and WSi layer 26 is patterned to leave a wiring layer 28 of a desired pattern.

The TiN layer 24 of the wiring layer functions as an impurity diffusion preventing layer. More particularly, without the TiN layer 24, $n^+$-type impurities doped in the $n^+$-type region 16 such as phosphorus or arsenic would diffuse laterally from the $n^+$-type region 16 to the $p^+$-type region 18 via the WSi layer 26 during the thermal treatment at about 800° to 900° C. to be performed after the impurity doping, because the $n^+$-type impurities such as phosphorous and arsenic have a high diffusion coefficient in a refractory metal silicide such as WSi. The ohmic contact to the $p^+$-type region 18 would therefore be degraded and the contact resistance would increase. In order to prevent the lateral diffusion of $n^+$-type impurities, the TiN layer 24 is placed under the WSi layer 26.

With this conventional technique, however, it is difficult to obtain a good ohmic contact to the $n^+$-type region 16 because of the direct contact of the TiN layer 24 to the silicon surface. Furthermore, because of the laminated structure of the TiN layer 24 and underlying polycrystalline silicon layer 22, it is necessary to form the contact holes for the regions 16 and 18 at different processing steps, and to selectively dope impurities in the polycrystalline layer 22.

SUMMARY OF THE INVENTION

It is an object of the present invention to provide a semiconductor device having a laminated wiring structure easy to manufacture and being capable of providing a low resistance of a wiring connecting regions of opposite conductivity types. More particularly, the present invention provides a laminated wiring structure of a refractory metal layer of an appropriate thickness and an impurity diffusion-preventing conductive metal layer overlaying the refractory metal layer as a local interconnection.

According to one aspect of the present invention, there is provided a laminated wiring structure for interconnecting $n^+$-type and $p^+$-type regions of a CMOS device provided on a semiconductor substrate, comprising: a titanium layer of 100 angstrom or less thickness which directly and ohmically contacts to said semiconductor substrate; a diffusion-preventing conductive layer overlaying said titanium layer for preventing diffusion of impurities from said $n^+$-type and $p^+$-type regions provided on semiconductor substrate; and refractory metal silicide layer overlaying said diffusion-preventing conductive nitride layer.

According to another aspect of the present invention, there is provided a semiconductor device comprising: a semiconductor substrate; first and second impurity doped regions of opposite conductivity types, the first and second impurity doped regions being formed separately on the surface of the semiconductor substrate; an insulating film formed on the surface of the semiconductor substrate and having first and second contact holes at areas corresponding to the first and second impurity doped regions; and a wiring layer formed on the insulating film and interconnecting the first and second impurity doped regions via the first and second contact holes, the wiring layer being a low resistance laminated layer including an ohmic contact metal layer, an impurity diffusion-preventing conductive layer, and a low resistance conductive layer, disposed in this order from the bottom.

Since the ohmic contact metal layer is provided under the impurity diffusion-preventing conductive layer, a good ohmic contact can be made between the wiring layer and the first and second impurity doped regions. Furthermore, since a polycrystalline layer is not used, a selective impurity doping process is not required.

As a wiring layer interconnecting semiconductor regions of opposite conductivity types, a laminated layer is used which is formed by an ohmic contact metal layer, an impurity diffusion-preventing conductive layer, and a refractory metal layer or a refractory metal silicide layer, disposed in this order from the bottom. It is therefore possible to provide a wiring layer easy to manufacture and having a low wiring resistance.

DETAILED DESCRIPTION OF THE PREFERRED EMBODIMENTS

Figure 1:
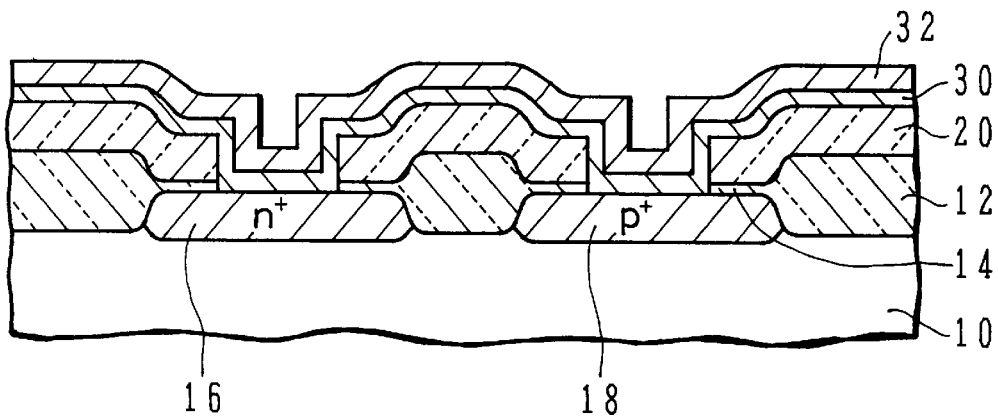
FIGS. 1 to 4 are cross sectional views of a semiconductor substrate explaining a series of processing steps for forming a wiring structure, according to an embodiment of the present invention.
Figure 2:
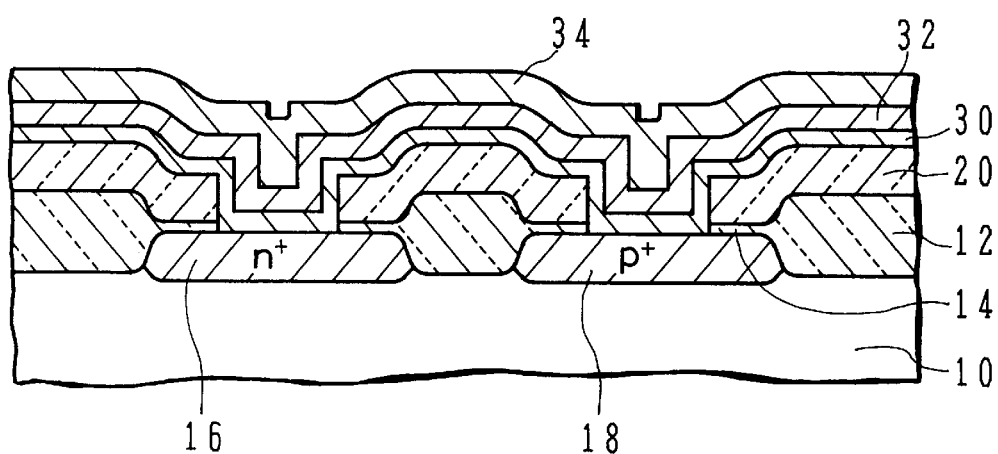
Figure 3:
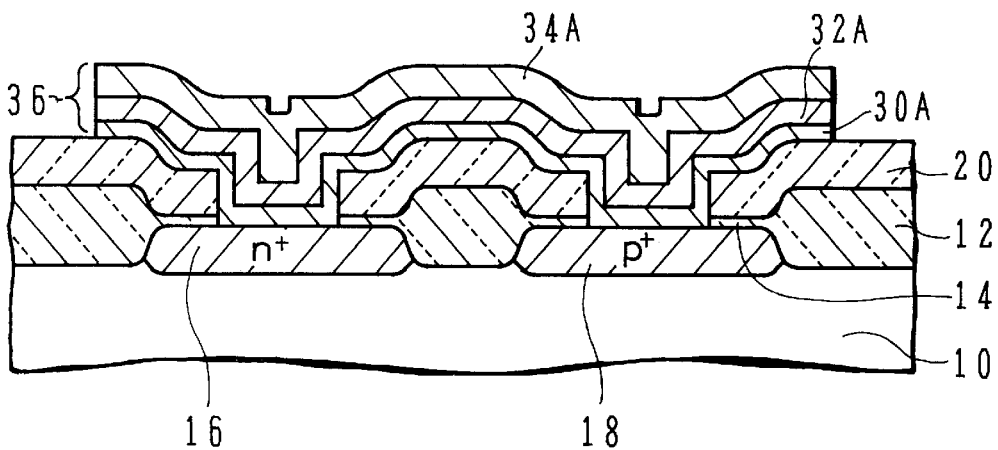
Figure 4:
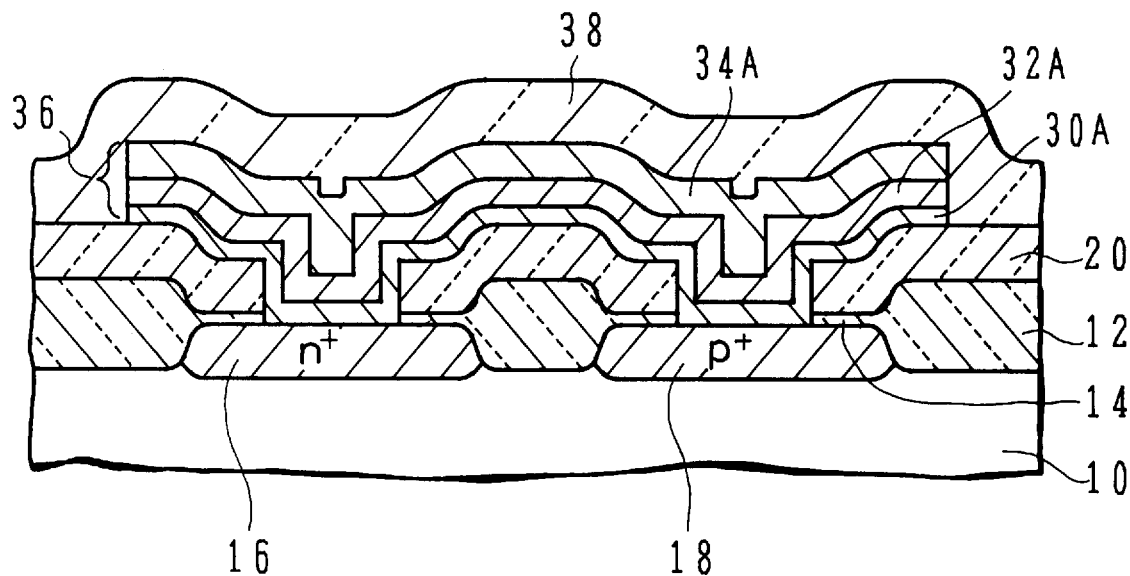
Figure 5:
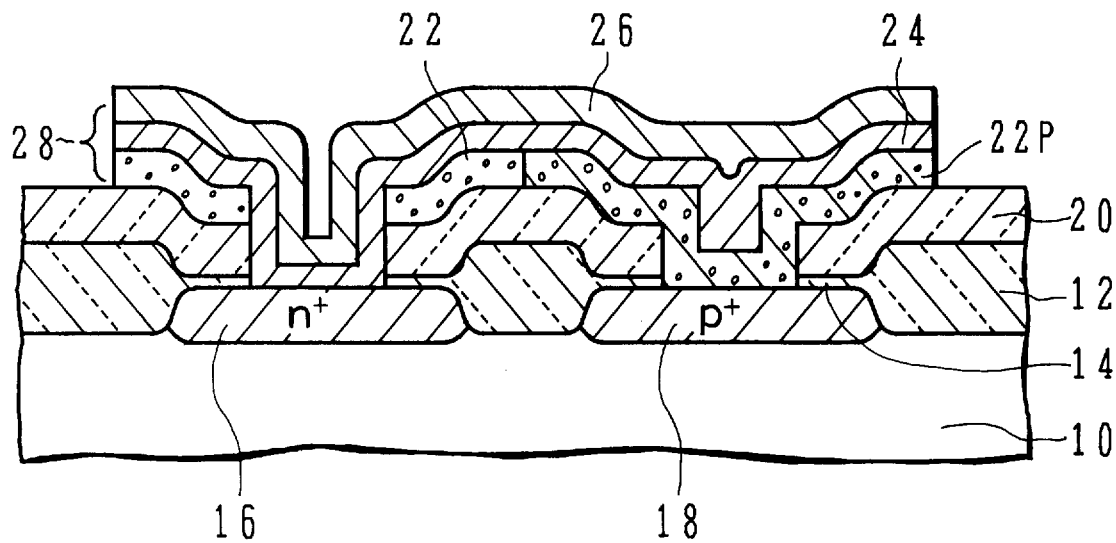
FIG. 5 is a cross sectional view showing the wiring structure of a conventional semiconductor substrate.

FIGS. 1 to 4 are cross-sections explaining a series of processing steps for obtaining a wiring structure according to an embodiment of the present invention. The processing steps (1) to (4) correspondingly illustrated in FIGS. 1 to 4 will be sequentially described in this order.

(1) On the surface of a semiconductor substrate 10 made of silicon for example, there are formed a field insulating film 12, a thin insulating film 14, a first moat region of $n^+$-type 16 with which are MOS transistor is to be manufactured, and a second moat region of $p^+$-type 18 with which another MOS transistor is to be manufactured, and other regions. The first moat region of $n^+$ type 16 is formed through ion-implantation with a dose of $10^{15}$–$10^{16}$ cm$^{-2}$ of phosphorus P. The moat region of $p^+$ type 18 is formed through ion-implantation with a dose of $10^{15}$–$10^{16}$ cm$^{-2}$ of boron B. The insulating films 12 and 14 are formed, for example, by oxidizing the silicon substrate surface to change it into silicon oxide. An insulating film 20 of silicon oxide or the like is then formed above the substrate by chemical vapor deposition (CVD). A resist mask is formed on the insulating film 20, the mask having holes at areas corresponding to the $n^+$-type and $p^+$-type regions 16 and 18. A selective etching process is performed using this resist mask to form contact holes through the insulating films 20 and 14 down to the $n^+$-type and $p^+$-type regions 16 and 18.

Next, sputtering processes are sequentially performed, both in a vacuum state, to sequentially form laminated interconnection layers of a refractory metal layer 30 having a thickness of 100 angstrom (A) or less and a TiN layer 32 overlaying the refractory metal layer 30, above the substrate. For example, a Ti layer is deposited as the refractory metal layer 30. The conditions for manufacturing the Ti layer 30 through the sputtering technique are as follows:

sputter gas: Ar
pressure: 3 mTorr
target material: Ti
substrate temperature: 150° C.

Molybdenum, cobalt and tantalum can also be used as the refractory metal.

The Ti layer 30 is used as an underlayer of the TiN layer 32 to obtain an ohmic contact to the substrate. Furthermore, the TiN layer 32 is deposited to prevent impurities doped in the first and second moat regions 16 and 18 from diffusing into an upper conductive layer to be provided thereon. In other words, the TiN layer 32 is used for preventing the lateral diffusion of impurities into an overlying silicide layer. In a sample according to an embodiment of the present invention, the Ti layer 30 is deposited with a thickness of 100 angstroms or less, and the TiN layer 32 is deposited with a thickness of about 1000 angstroms.

TiN layer is deposited by sputtering under the following conditions:

sputter gas: Ar+$N_2$
pressure: 4 mTorr
target material: Ti
substrate temperature: 150° C.

The thickness of the Ti layer is determined according to an experiment performed by an inventor of the present invention which is explained hereafter.

To form a TiN layer, following two-step process may be considered as a comparative example:

1. Depositing Ti layer (ex.: 500–2000 angstroms thickness); and

2. After step 1, heating (at 675° C.) the deposited Ti layer in a nitrogen ambient for 20–60 minutes.

The products according to the present embodiment are distinct from products manufactured by the comparative example process. The comparative example process requires an additional high-temperature heating step with 20–60 minutes. By way of contrast, the process of the present embodiment eliminates such a long period additional heating step. Therefore, production time of the present embodiment is also reduced.

(2) Next, an upper conductive layer 34 is formed by CVD, sputtering or other processes, covering the TiN layer 32. For example, a WSi layer is used as the upper conductive layer. However, tungsten, molybdenum, and molybdenum silicide can also be applicable as the upper conductive layer. The thickness of the WSi layer 34 is 2000–2500 angstroms. The upper conductive layer 34 is provided to lower the total resistance value of a laminated wiring layer of the refractory metal layer 30, TiN layer 32, and WSi layer 34.

(3) Next, using a resist mask or other means, the laminated structure of the Ti layer 30, TiN layer 32, and WSi layer 34 is patterned to leave a wiring layer 36 of a desired pattern having a Ti layer 30A, TiN layer 32A, and WSi layer 34A. The wiring layer 36 interconnects the $n^+$-type and $p^+$-type regions 16 and 18.

(4) An interlayer insulating film 38 such as phosphosilicate glass is formed above the substrate by CVD or other processes. Thereafter, a rapid thermal annealing at about 850°–1000° C., is performed with an annealing lamp for 5 seconds to 1 minute in a nitrogen ambient.

In the rapid thermal annealing step, the refractory metal layer 30 is restricted to chemically reacting with silicon atoms only in a surface region of the silicon substrate to form a refractory metal silicide thereon. The resultant refractory metal silicide includes silicon atoms therein which accelerates out-diffusion of impurities doped in the moat regions. In the preferred embodiment of the present invention, silicide formation is minimized due to rapid thermal annealing. Further, Ti (in which the diffusion coefficient of impurities is smaller than that in a silicide substance) still remains after the rapid thermal annealing in the present embodiment. As a result, counter-diffusion from moat regions is prevented. In the present specification, the counter-diffusion is defined as lateral diffusion of impurities (e.g., diffusion of p-type impurity, doped in a moat region of $p^+$-type, which laterally diffuses into an opposite moat region of $n^+$-type through an interconnection of the refractory metal layer, and vice versa). The consumption of impurities results in increase of contact resistance. The present embodiment ameliorates contact resistance of an interconnection between different type of moat regions.

To determine an appropriate thickness of the Ti layer 30 as an interconnection which keeps ohmic contact to $n^+$ and $p^+$ regions even after it is subjected to a heat treatment (at 850° C.), the contact resistance Rc between the sample laminated wirings consisting of TiN and Ti layers and the semiconductor substrate is measured. The conditions of samples of the experiments are as follows:

Sample A: TiN=1000 angstroms, Ti=200 angstroms
Sample B: TiN=1000 angstroms, Ti=100 angstroms
Sample C: TiN=1000 angstroms, Ti=50 angstroms To measure the contact resistance Rc, the sample laminated wirings are deposited and patterned to the longitudinal direction of the $n^+$ and $p^+$-type regions at a right angle. Then, current is applied from one end of the sample laminated wiring to one end of longitudinal direction of the $n^+$ and $p^+$-type regions through the contact. Also, the voltage drop is measured between the other end of the sample laminated wiring and the end of longitudinal direction of the n$^+$ and p$^+$-type regions. In this experiment, the contact resistance Rc is measured at a current of 1 mA.

Table 1 shows the measured values for the contact resistance Rc and contact state between the laminated wirings and the semiconductor substrate.

TABLE 1

|           | Rc (p channel) | Rc (n channel) | contact   |
|-----------|----------------|----------------|-----------|
| Sample A  | 422 ohm        | 117 ohm        | non-ohmic |
| Sample B  | 140 ohm        | 17 ohm         | ohmic     |
| Sample C  | 115 ohm        | 18 ohm         | ohmic     |

As can be understood from Table 1, the contact between the laminated wirings and the substrate turns out to be ohmic contacts when the thickness of the Ti layer is about 100 angstroms or less. It is considered that similar results will be obtained when the refractory metal layer is formed of molybdenum, cobalt or tantalum.

The wiring structure thus obtained is suitable for use in a complementary MOS type LSI or the like. Use of the Ti layer 30A under the TiN layer 32A provides a good ohmic contact between the wiring layer 36 and regions 16 and 18.

Figure 6A:
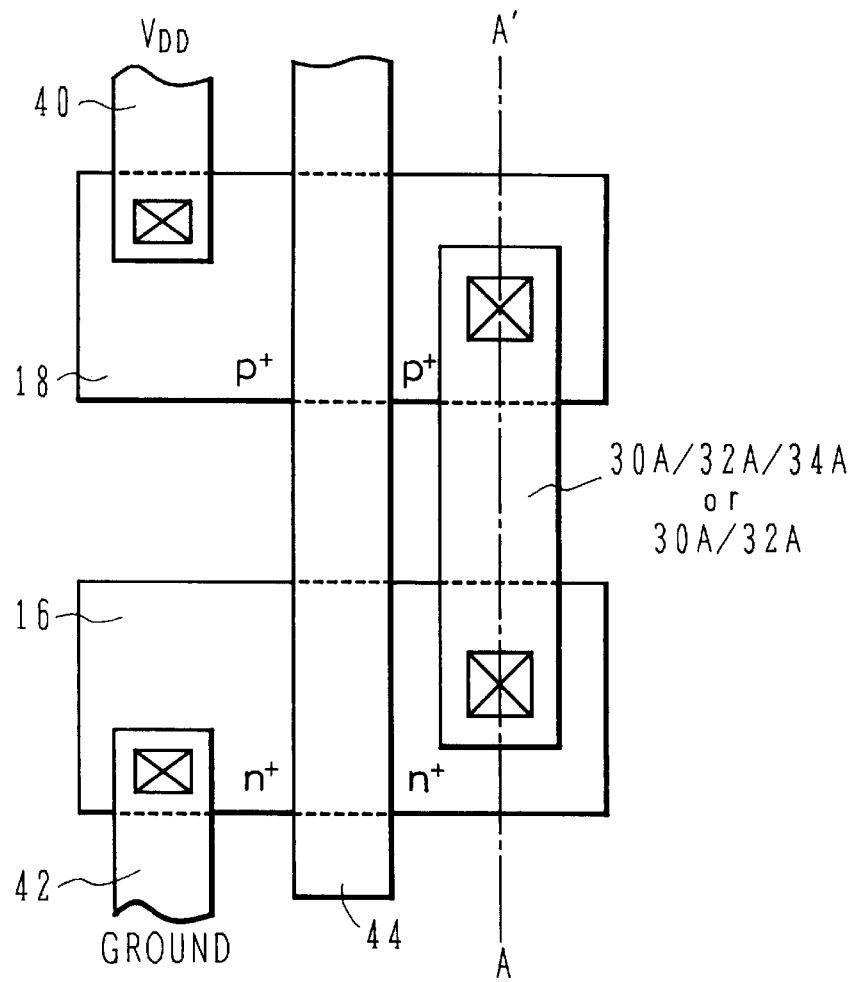
FIGS. 6A and 6B are a plan view and an equivalent circuit diagram of a CMOS circuit.
Figure 6B:
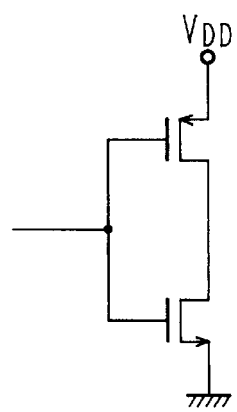

An example of the device applicability of the above embodiment is shown in FIGS. 6A and 6B. FIG. 6A shows a CMOS inverter. The cross-sections shown in FIGS. 1 to 4 correspond to those taken along line AA' in FIG. 6A. In FIG. 6A, an input signal is provided on a polysilicon line 44 which gates both a PMOS transistor in a PMOS moat region 18 and an NMOS transistor in an NMOS moat region 16. Metal contact 40 and 42 are used to connect one source/drain of the PMOS transistor to power supply, and to connect one source/drain of the NMOS transistor to ground. The output of the inverter is provided on a local interconnect 30A/32A/34A which runs over a field oxide. FIG. 6B shows an equivalent circuit of the structure of FIG. 6A.

Instead of a refractory metal silicide such as WSi, a refractory metal such as W may be used as the material of the low-resistance layer 34 (34A). In this case, a rapid thermal annealing technique is employed to heat at 800° to 900° C. for 5 sec. to 1 minute. The wiring layer 36 may also be used for the interconnection between n$^+$-type regions and between p$^+$-type regions.

Figure 7:
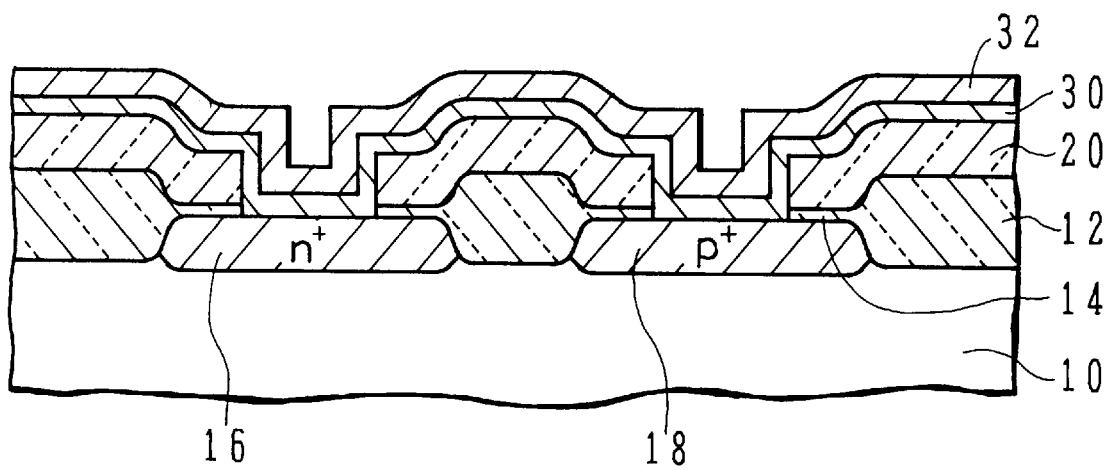
FIGS. 7 to 9 are cross sectional views of a semiconductor substrate explaining a series of processing steps for forming a wiring structure, according to another embodiment of the present invention.
Figure 8:
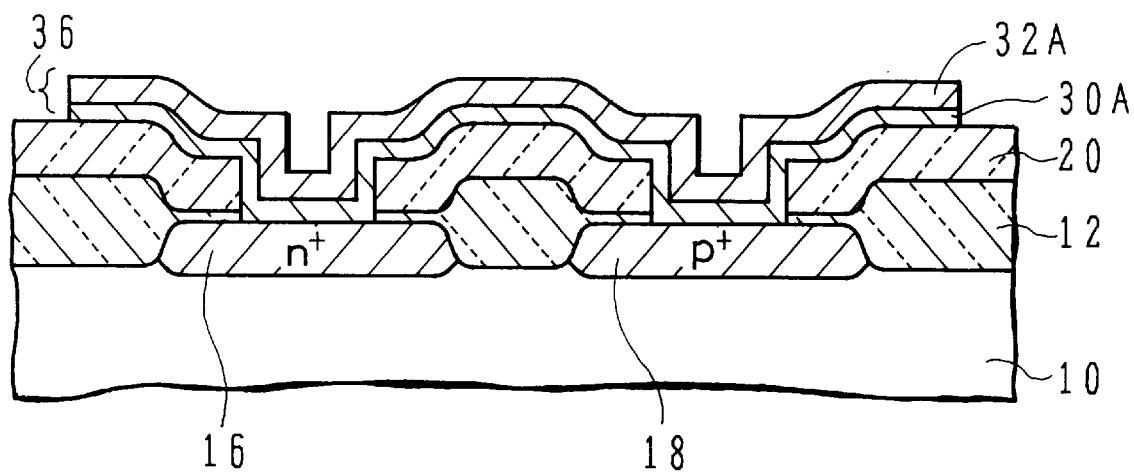
Figure 9:
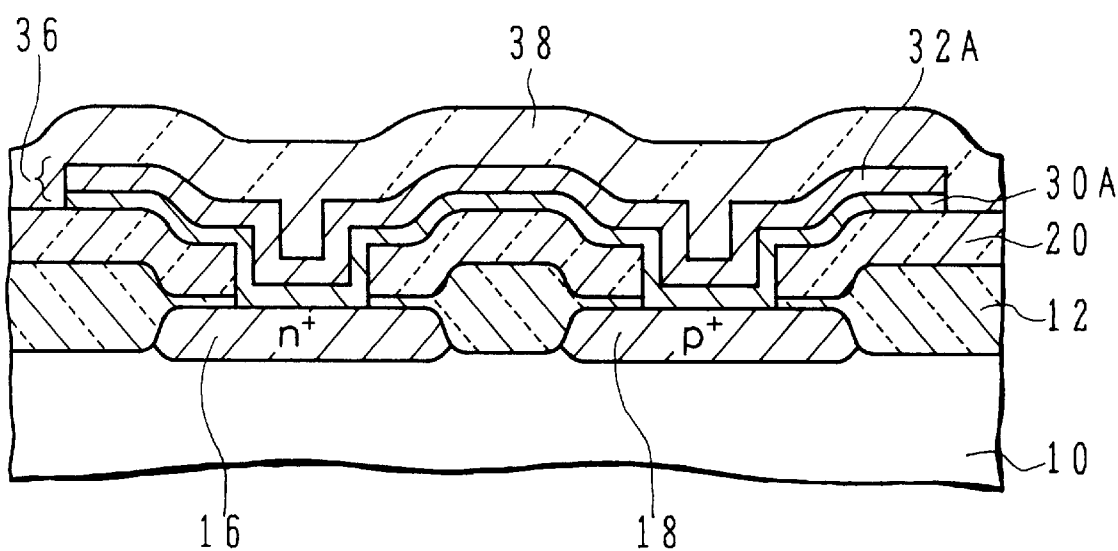

FIGS. 7 to 9 show a sequence of steps for manufacturing a wiring structure according to another embodiment of the present invention. The cross-sections in FIGS. 7 to 9 also correspond to the cross-sections taken along line AA' in FIG. 6A. Those manufacturing steps (7)–(9) corresponding to FIGS. 7–9 will be successively explained.

(7) On a surface of semiconductor substrate 10, for example, of silicon, field insulating films 12, thin insulating films 14, n$^+$-type region 16, p$^+$-type region 18 are formed. The insulating films 12 and 14 are formed, for example, by oxidizing a surface region of the substrate, and are formed of silicon oxide, or the like. On the upper surface of the substrate, an insulating film 20 made, for example, of silicon oxide is formed by chemical vapor deposition, or the like. Then, contact holes penetrating through the insulating film 20 and the thin insulating film 14 to expose the n$^+$-type region 16 and p$^+$-type region 18 are formed by selective etching using a resist layer as a mask.

Then, a refractory metal layer 30, for example, of Ti, and a TiN layer 32 are successively formed by continuously performing a sputtering treatment on the substrate surface without breaking the vacuum atmosphere. The Ti layer 30 is provided for forming an ohmic contact with the substrate surface and preferably has a thickness of about 100 angstroms or less. The TiN layer 32 is provided for preventing lateral diffusion of the impurities and also for serving as a conductive layer.

For example, a Ti layer is deposited as the refractory metal layer 30, by sputtering under the following conditions:

sputter gas: Ar pressure: 3 mTorr target material: Ti substrate temperature: 150° C.

Molybdenum, cobalt and tantalum can also be used as a refractory metal.

The TiN layer is deposited by sputtering under the following conditions:

sputter gas: Ar+N$_2$ pressure: 4 mTorr target material: Ti substrate temperature: 150° C.

(8) Next, the laminate made of the Ti layer 30 and the TiN layer 32 are patterned according to a desired wiring pattern, to form a wiring layer 36 made of the remaining Ti layer 30A and TiN layer 32A. As a result, the n$^+$-type region 16 and the p$^+$-type region 18 are interconnected by the wiring layer 36.

(9) Then, an interlayer insulating film 38 formed, for example, of phosphosilicate glass, is formed on the substrate surface by chemical vapor deposition. In place of phosphosilicate glass, other silicate glass of a low softening temperature may also be used.

For flowing the insulating film 38 to improve the surface flatness, and for reducing the resistance of the TiN layer 32A, the substrate is subjected to rapid thermal annealing (RTA) using the heat lamp in a nitrogen atmosphere, at a temperature of about 850°–1000° C., for 5 seconds to 1 minute. A wiring structure explained with reference to FIGS. 7 to 9, is also applicable to a device shown in FIGS. 6A and 6B.

Although the local interconnect between an n$^+$-type region and a p$^+$-type region has been described, such a wiring structure can be used to connect a pair of n-type regions or a pair of p-type regions.

Here, the effect of rapid thermal annealing in the above-described embodiments was investigated by employing the sample structures according to the above embodiments and varying the annealing temperature at 700, 850, and 1000° C. The annealing time for each annealing treatment was set at 10 seconds. The resistivity and wiring resistance of the respective samples obtained by these annealings are shown below.

TABLE 2

Resistivity and Wiring Resistance

| RTA temperature | 700° C. | 850° C. | 1000° C. |
|---|---|---|---|
| WSi resistivity | 550 | 280 | 150 |
| TiN resistivity | 110 | 90 | 70* |
| resistance of WSi/TiN/Ti = 250/100/5 nm | 5.5 | 3.0 | 2.2 Ω/□ |
| resistance of TiN/Ti = 100/5 nm | 8.2 | 5.8 | 4.8 Ω/□ |

The mark * shows that the film is peeled off upon thermal treatment. Peeling off is considered to be ascribed to internal stress.

From these experimental results, it can be seen that the annealing temperature is preferably about 850° to 1000° C.

The above-described wiring structure is adapted for use as a local interconnection in complimentary MOS LSI, or the like. Provision of the Ti layer 30A under the TiN layer 32A enables the attainment of a good ohmic contact between the regions 16 and 18 and the wiring layer 36.

The present invention has been described in connection with the preferred embodiments. The invention is not intended to be limited only to the above-described embodiments. It would be obvious for those skilled in the art to make various modifications, changes, replacements, combinations, improvements, and the like within the scope and spirit of the appended claims, based upon the above-described disclosure.

I claim:

1. A method for manufacturing a semiconductor device, the method comprising the steps of:
    (a) providing a semiconductor substrate having first and second conductive regions;
    (b) depositing a refractory metal layer having a thickness of about 100 angstroms or less on the semiconductor substrate;
    (c) depositing a counter-diffusion barrier layer over the refractory metal layer to provide a laminated conductive wiring layer mutually connecting the first and second conductive regions;
    (d) forming an interlayer insulating layer over the laminated conductive wiring; and
    (e) rapid thermal annealing the semiconductor substrate after step (d) to provide ohmic contact between the refractory metal layer and the semiconductor substrate.

2. The method of claim 1, including the step of:
    (c-1) depositing an upper conductive layer over the counter-diffusion barrier layer to provide a laminated conductive wiring layer mutually connecting the first and second conductive regions.

3. The method of claim 2, wherein the upper conductive layer includes a substance selected from a group consisting of tungsten, molybdenum, tungsten silicide and molybdenum silicide.

4. The method of claim 3, wherein the tungsten silicide layer is deposited as the upper conductive layer through one of chemical vapor deposition and sputtering.

5. The method of claim 2, including the step of:
    (c-2) patterning the laminated conductive wiring, after step (c-1), to provide an interconnecting wiring mutually connecting said first and second conductive regions.

6. The method of claim 1, wherein in step (b), the refractory metal layer consists essentially of a refractory metal selected from a group consisting of titanium, molybdenum, cobalt and tantalum.

7. The method of claim 1, wherein in step (c), the counter-diffusion barrier layer includes titanium nitride.

8. The method of claim 1, wherein in steps (b) and (c), the refractory metal layer and the barrier layer are formed by sputtering.

9. The method of claim 1, wherein in step (e), the rapid thermal annealing is performed at a temperature between about 850°–1000° C. for about 5 seconds to about 1 minute.

10. A method for manufacturing a semiconductor device, the method comprising the steps of:
    (a) providing a semiconductor substrate having a first conductive region having a first conductivity type including a first impurity and a second conductive region having a second conductivity type including a second impurity;
    (b) forming a wiring layer mutually connecting the first and second conductive regions, the wiring layer having a laminated structure and a refractory metal layer having a thickness of about 100 angstroms or less thereunder;
    (c) forming an interlayer insulating layer over the wiring layer; and
    (d) rapid thermal annealing the semiconductor substrate after step (c), while preventing the first and second impurities from counter-diffusing from the interconnected first conductive region into the second conductive region through the refractory metal layer.

11. The method of claim 10, wherein step (b) includes the steps of:
    (b-1) depositing the refractory metal layer over the semiconductor substrate;
    (b-2) depositing a counter-diffusion barrier layer over the refractory metal layer to provide a first laminated conductive wiring connecting the first and second conductive regions; and
    (b-3) depositing an upper conductive layer over the barrier layer to provide a second laminated conductive wiring connecting the first and second conductive regions.

12. The method of claim 11, wherein the upper conductive layer includes a substance selected from a group consisting of tungsten, molybdenum, tungsten silicide and molybdenum silicide.

13. The method of claim 12, wherein the tungsten silicide layer is formed as the upper conductive layer through chemical vapor deposition.

14. The method of claim 11, including the step of:
    (c-2) patterning the second laminated conductive wiring.

15. The method of claim 11, wherein in the step (b-2), the counter-diffusion barrier layer includes titanium nitride.

16. The method of claim 11, wherein in steps (b-1) and (b-2), the refractory metal layer and the barrier layer are formed by sputtering.

17. The method of claim 10, wherein in step (b), the refractory metal layer includes a refractory metal selected from a group consisting of titanium, molybdenum, cobalt and tantalum.

18. The method of claim 10, wherein in step (d), the rapid thermal annealing is performed at a temperature between about 850°–1000° C. for about 5 seconds to about 1 minute.

19. A method of manufacturing a semiconductor device, the method comprising the steps of:
    (a) providing a semiconductor substrate having first and second conductive regions;
    (b) depositing a titanium layer having a thickness of about 100 angstroms or less over the semiconductor substrate;
    (c) depositing a titanium nitride layer over the titanium layer to provide a laminated conductive wiring layer mutually connecting the first and second conductive regions;
    (d) forming an interlayer insulating layer over the laminated conductive wiring layer; and
    (e) rapid thermal annealing the semiconductor substrate to provide an ohmic contact between the refractory metal layer and the semiconductor substrate.

20. The method of claim 19, including the step of:
    (f) forming a tungsten silicide layer having a thickness of about 2000–2500 angstroms over the titanium nitride layer.

21. A method for manufacturing a semiconductor device, the method comprising the steps of:
   (a) providing a silicon substrate having a first conductive region of a first conductivity type and a second conductive region having a second conductivity type opposite to the first conductivity type;
   (b) depositing a refractory metal layer having a thickness of about 100 angstroms or less on the silicon substrate;
   (c) forming a counter-diffusion barrier layer over the refractory metal layer;
   (d) patterning said barrier layer and said refractory metal layer, to provide a laminated conductive wiring mutually connecting the first and second conductive regions;
   (e) forming an interlayer insulating layer over the laminated conductive wiring; and
   (f) rapid thermal annealing the silicon substrate after step (e) to provide ohmic contact between the refractory metal layer and the silicon substrate.

22. The method of claim 21, wherein said first and second conductive regions are separate silicon elements, and said laminated conductive wiring is an interconnection wiring.

23. The method of claim 22, wherein said step (f) forms a refractory metal silicide layer at an interface between said refractory metal layer and said first and second conductive regions, and the refractory metal silicide layer extends across part of a thickness of said refractory metal layer.

24. The method of claim 23, wherein said refractory metal consists essentially of a single metal selected from the group consisting of titanium, molybdenum, cobalt and tantalum.

25. The method of claim 24, wherein said barrier layer is formed of a nitride of said refractory metal.

26. The method of claim 25, wherein said step (f) includes said rapid thermal annealing at a temperature of about 850°–1000° C.

27. A method for manufacturing a semiconductor device, the method comprising the steps of:
   (a) providing a silicon substrate having a first conductive region of a first conductivity type including a first impurity and a second conductive region having a second conductivity type opposite to the first conductivity type including a second impurity;
   (b) forming a wiring laminate including a refractory metal layer having a thickness of about 100 angstroms or less on said silicon substrate and contacting said first and second conductive regions, a counter-diffusion barrier layer on said refractory metal layer and an upper conductive layer on said barrier layer;
   (c) patterning said wiring laminate to form an interconnection interconnecting said first and second conductive regions;
   (d) forming an interlayer insulating layer over the wiring layer; and
   (e) rapid thermal annealing the silicon substrate after step (d), for a time period sufficiently long to form a first refractory metal silicide at an interface between said refractory metal layer and said first and second conductive regions, and not long enough to convert a full thickness of said refractory metal layer to said first refractory metal silicide.

28. The method of claim 27, wherein said refractory metal is titanium, said barrier layer is titanium nitride, and said upper conductive layer is a second refractory metal silicide.

* * * * *